(12) United States Patent
Kim

(10) Patent No.: US 8,026,584 B2
(45) Date of Patent: Sep. 27, 2011

(54) SEMICONDUCTOR PACKAGE, MODULE, SYSTEM HAVING SOLDER BALL COUPLED TO CHIP PAD AND MANUFACTURING METHOD THEREOF

(75) Inventor: Hye-jin Kim, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 51 days.

(21) Appl. No.: 12/251,534

(22) Filed: Oct. 15, 2008

(65) Prior Publication Data

US 2009/0102037 A1    Apr. 23, 2009

(30) Foreign Application Priority Data

Oct. 18, 2007   (KR) .................. 10-2007-0105040

(51) Int. Cl.
*H01L 21/00* (2006.01)
(52) U.S. Cl. ............... 257/686; 257/738; 257/E21.502; 257/E23.023; 438/109
(58) Field of Classification Search .......... 257/701–703, 257/785, 786, 779, 678, 685–686, E21.502, 257/E23.023
See application file for complete search history.

(56) References Cited

U.S. PATENT DOCUMENTS

| | | | | |
|---|---|---|---|---|
| 5,229,647 A * | 7/1993 | Gnadinger | ................. | 257/785 |
| 5,355,016 A * | 10/1994 | Swirbel et al. | ................. | 257/659 |
| 5,485,039 A * | 1/1996 | Fujita et al. | ................. | 257/774 |
| 6,406,939 B1 | 6/2002 | Lin | | |
| 6,969,917 B2 * | 11/2005 | Hacke et al. | ................. | 257/785 |
| 2001/0049772 A1* | 12/2001 | Choi et al. | ................. | 711/138 |
| 2003/0141583 A1* | 7/2003 | Yang | ................. | 257/686 |
| 2003/0232460 A1* | 12/2003 | Poo et al. | ................. | 438/106 |
| 2005/0189634 A1* | 9/2005 | Wakiyama et al. | ................. | 257/678 |
| 2005/0205968 A1* | 9/2005 | Kim | ................. | 257/621 |
| 2007/0235862 A1* | 10/2007 | Chang et al. | ................. | 257/723 |

FOREIGN PATENT DOCUMENTS

| | | | |
|---|---|---|---|
| JP | 02140960 A | * | 5/1990 |
| JP | 06-338539 | | 12/1994 |
| JP | 07-122589 | | 5/1995 |
| JP | 07122589 A | * | 5/1995 |

* cited by examiner

*Primary Examiner* — Leonardo Andujar
(74) *Attorney, Agent, or Firm* — Stanzione & Kim, LLP

(57) ABSTRACT

A semiconductor package structure having a solder ball coupled to a chip pad and a manufacturing method thereof, a semiconductor package module, and a system. A circuit board includes a through hole therein, and a conductor is formed on a sidewall of the through hole. A first semiconductor chip including a first chip pad is mounted on the circuit board. A solder ball is disposed in the through hole and is bonded to the conductor and the first chip pad. Therefore, an underfill can be removed from a semiconductor package, and thus, the semiconductor package can be reduced in thickness.

3 Claims, 7 Drawing Sheets

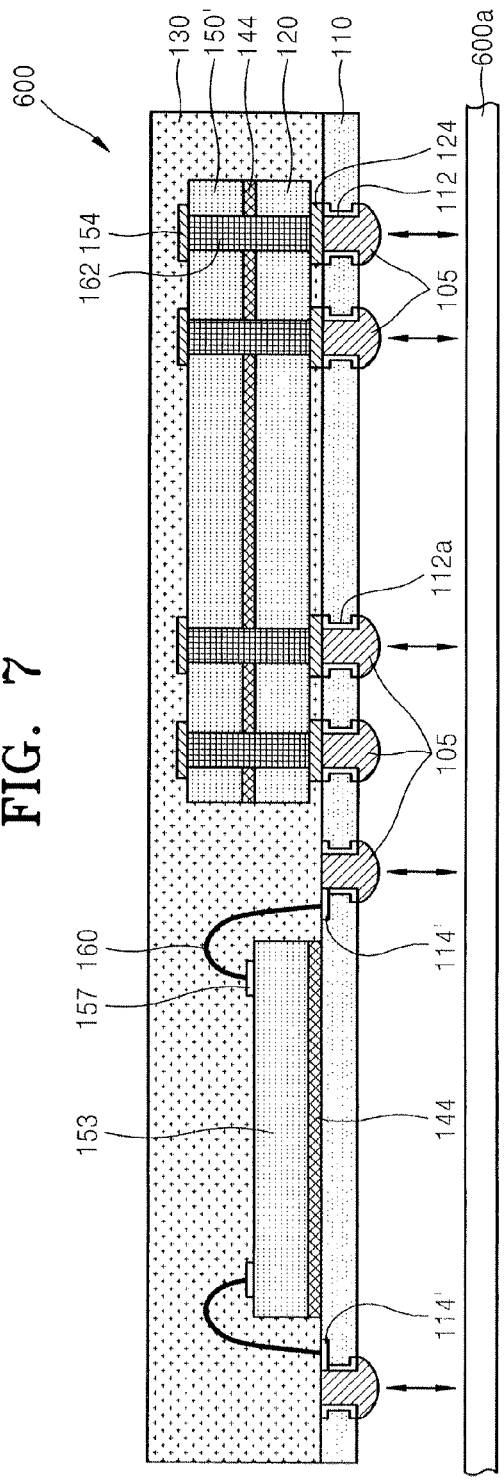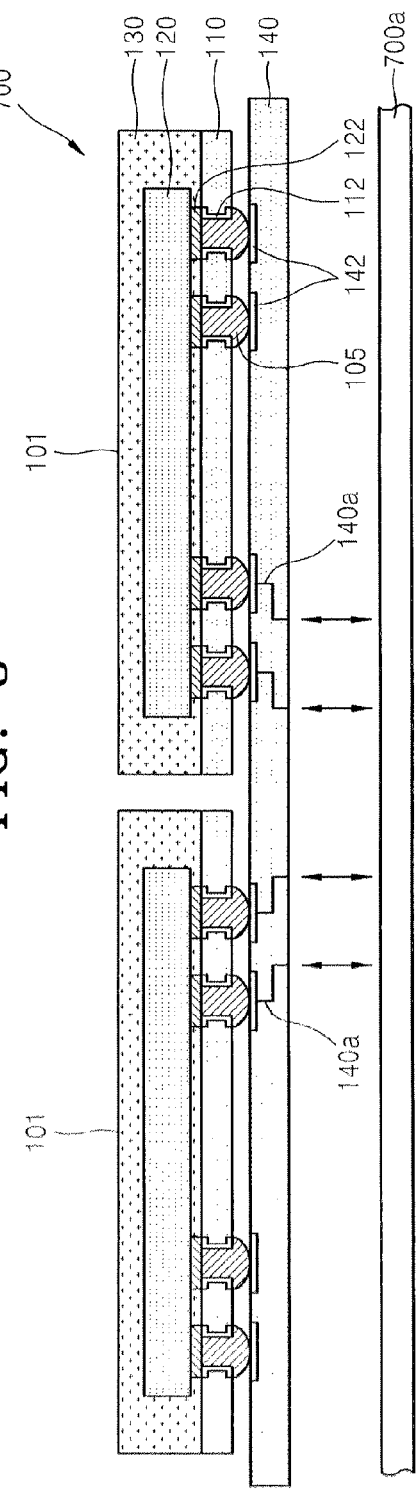

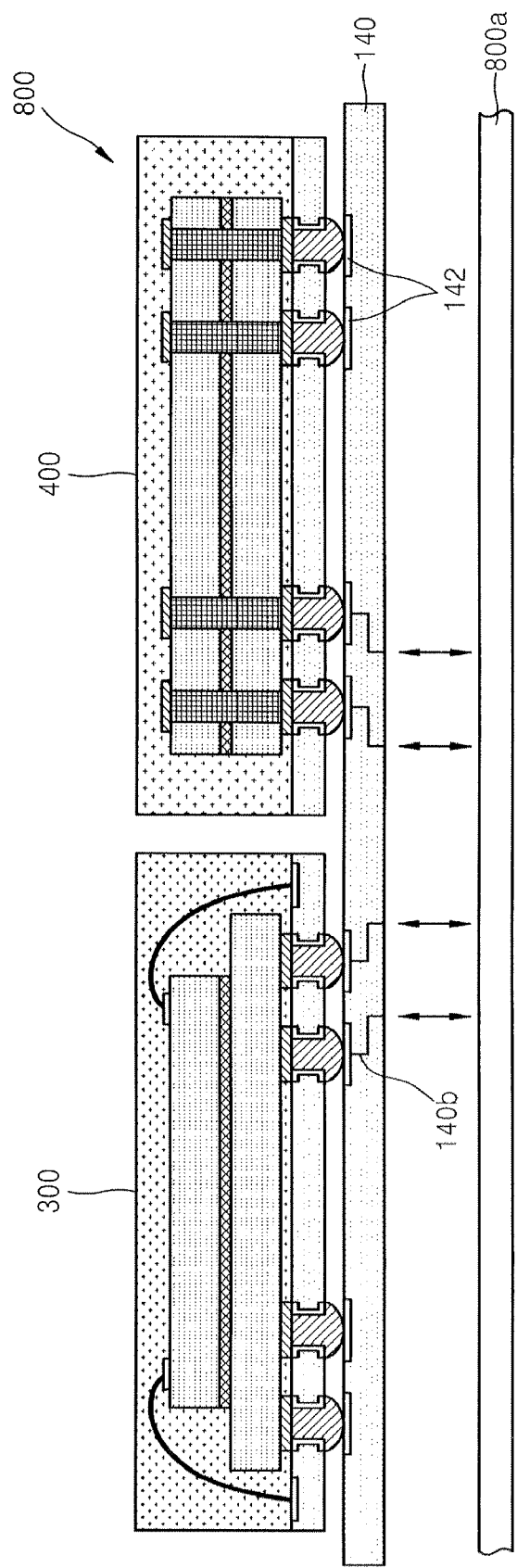

SEMICONDUCTOR PACKAGE, MODULE, SYSTEM HAVING SOLDER BALL COUPLED TO CHIP PAD AND MANUFACTURING METHOD THEREOF

CROSS-REFERENCE TO RELATED APPLICATIONS

This application claims priority under 35 U.S.C. §119(a) from Korean Patent Application No. 10-2007-0105040, filed on Oct. 18, 2007, in the Korean Intellectual Property Office, the disclosure of which is incorporated herein in its entirety by reference.

BACKGROUND OF THE INVENTION

1. Field of the Invention

The present general inventive concept relates to a semiconductor device and a manufacturing method thereof, and more particularly, to a ball grid array (BGA) semiconductor package, a semiconductor package module, a system using a solder ball and a manufacturing method thereof.

2. Description of the Related Art

A packaging method of a flip chip package includes the following processes: A bump is formed on a semiconductor chip. In a wafer sawing process, a wafer is cut into unit semiconductor chips. In a flip chip attachment process, a surface of the unit semiconductor chips, where the bump is formed, is attached onto a circuit board used as a base plate of a semiconductor package such as a printed circuit board (PCB) or a tape wiring board. An insulating material is filled between the unit semiconductor chips and the circuit board in an underfill process, and a sealing resin covers a portion of the unit semiconductor chips and the circuit board in a molding process. Then, a solder ball is attached to a solder ball pad under the circuit board.

SUMMARY OF THE INVENTION

The present general inventive concept provides a semiconductor package capable of preventing a reliability decrease of the semiconductor package due to an underfill.

Additional aspects and utilities of the present general inventive concept will be set forth in part in the description which follows and, in part, will be obvious from the description, or may be learned by practice of the general inventive concept.

The present general inventive concept also provides a method of manufacturing the semiconductor package.

The present general inventive concept also provides a semiconductor package module using the semiconductor package.

The present general inventive concept also provides a system including the semiconductor package or the semiconductor package module.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a semiconductor package including a circuit board including a through hole, a conductor formed on a sidewall of the through hole, a first semiconductor chip including a first chip pad mounted on the circuit board, and a solder ball disposed in a through hole of the conductor and bonded to the conductor and the first chip pad, and a method of forming the semiconductor package.

The foregoing and/or other aspects and utilities of the present general inventive concept may also be achieved by providing a semiconductor package including a circuit board including a through hole, a semiconductor chip including a chip pad disposed to correspond to the through hole, and a solder ball disposed in the through hole and bonded to the chip pad of the semiconductor chip.

The circuit board may further include a semiconductor circuit and an active surface, and the chip pad may be connected to the semiconductor circuit and mounted on the active surface to protrude from the active surface by a distance shorter than a thickness of the chip pad.

The circuit board and the semiconductor chip may be spaced apart from each other by a distance shorter than a thickness of the chip pad.

The circuit board may include an active surface on which the chip pad is formed, and a surface opposite to the active surface, and the solder ball may include a first portion disposed in the through hole and a second portion extended from the first portion to protrude from the surface to be connected to an external electrical apparatus.

The solder ball may not protrude from the active surface.

The semiconductor package may further include a conductor disposed in the through hole of the circuit board and disposed between the solder ball and a side wall defining the through hole to be electrically connected to the solder ball and the chip pad.

The though hole and the chip pad may have a common center axis of the solder ball.

The semiconductor package may further include a second semiconductor chip mounted on the semiconductor chip and having a second chip pad, a substrate pad disposed on the circuit board to be electrically connected to the solder ball, and a wire electrically connected to the second chip pad of the second semiconductor chip and the substrate pad of the circuit board.

The second semiconductor chip may include a second through hole in a direction parallel to the through hole, and an electrode disposed in the second through hole and electrically connected to the chip pad.

The through hole, the chip pad, the solder ball, and the second through hole are disposed in a same axis in a direction parallel to the through hole.

The foregoing and/or other aspects and utilities of the present general inventive concept may also be achieved by providing a system including a housing, a semiconductor package disposed in the housing and comprising a circuit board including a through hole, a semiconductor chip including a chip pad disposed to correspond to the through hole, and a solder ball disposed in the through hole and bonded to the chip pad of the semiconductor chip, and a processor disposed in the housing and electrically connected to the solder ball of the semiconductor package.

The system may further include a bus disposed between the processor and the solder ball to be connected to the solder ball.

The bus may be electrically connected to an external apparatus.

The system may further include an input/output device to generate a signal, so that the processor controls the semiconductor package to read and write data therein according to the signal.

BRIEF DESCRIPTION OF THE DRAWINGS

The above and other features and advantages of the present general inventive concept will become more apparent by describing in detail exemplary embodiments thereof with reference to the attached drawings in which:

FIG. 7 is a cross-sectional view illustrating a semiconductor package according to another embodiment of the present general inventive concept;

FIG. 8 is a cross-sectional view illustrating a semiconductor package module according to an embodiment of the present general inventive concept;

FIG. 9 is a cross-sectional view illustrating a semiconductor package module according to another embodiment of the present general inventive concept;

DETAILED DESCRIPTION OF THE PREFERRED EMBODIMENTS

Figure 1:
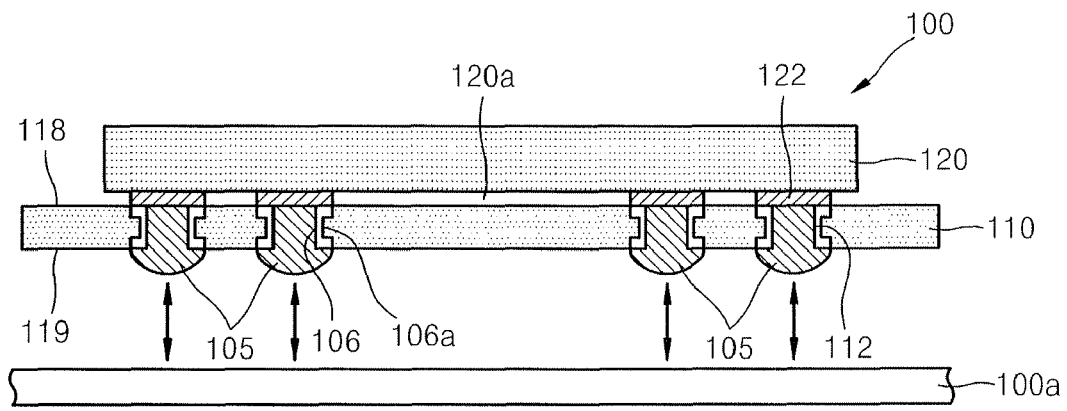
FIG. 1 is a cross-sectional view illustrating a semiconductor package according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a cross-sectional view illustrating a semiconductor package 100 according to an embodiment of the present general inventive concept.

Referring to FIG. 1, a circuit board 110 may include a first surface 118 and a second surface 119 that are opposite to each other. For example, the circuit board 110 may have a plate structure. The first surface 118 may be a top surface of the circuit board 110 and the second surface 119 may be a bottom surface of the circuit board 110. The circuit board 110 may be a rigid substrate formed of an FR4 or a BT resin or may be a flexible substrate. For example, the circuit board 110 may be a printed circuit board (PCB), a liquid crystal polymer (LCP) film, a polyimide (PI) film, or the like.

The circuit board 110 includes a side wall to define a through hole 106a such that a conductor 112 is formed on the sidewall of the through hole 106a so as to serve as an interconnection line of the circuit board 110 and improve the adhesion between a solder ball 105 and the circuit board 110. The conductor 112 may have a side wall to define a through hole 106.

A first semiconductor chip 120, including a first chip pad 122, may be mounted on the first surface 118 of the circuit board 110 such that the first chip pad 122 is disposed to face the conductor 112 formed in the circuit board 110. The first chip pad 122 may be directly in contact with the conductor 112.

The first chip pad 122 may have an area to correspond to an outer circumference of the conductor 112 or may have a thickness such that the surface of the circuit board 110 is spaced apart from the surface 120a of the first semiconductor chip 120 by a distance corresponding to the thickness.

The solder ball 105 may be formed in plural, disposed in the through hole 106 of the conductor or the circuit board 110, and bonded to the first chip pad 122 of the first semiconductor chip 120, so as to serve as an external terminal of the semiconductor package 100. Once the solder ball 105 is bonded to the first chip pad 122, the solder ball 105, the first chip pad 122, and the conductor 112 are electrically connected with each other, and an alloy is formed at an interface between the first chip pad 122 and the solder ball 105. Such an alloy of the first chip pad 122 and the solder ball 105 is called an intermetallic compound (IMC) and improves the solder joint. The first chip pad 122 and the conductor 112 may be formed of materials different from each other. For example, when the first chip pad 122 is formed of gold (Au), the conductor 112 may be formed of copper (Cu). However, even if the first chip pad 122 and the conductor 112 are formed of the same materials, an alloy of the solder ball 105 and the first chip pad 122 is formed at an interface therebetween, thus improving the solder joint. The solder ball 105 may protrude from the second surface 119 of the circuit board 110 to form the external terminal to be electrically connected to terminals of an external electrical apparatus 100a.

In order to form the alloy of the solder ball 105 and the first chip pad 122, an under bump metallurgy (UBM) layer may be formed on a surface of the first chip pad 122 to contact the solder ball 105. The UBM layer is a metal multilayer including a bonding layer, a diffusion barrier layer, and a wettable layer, and may contain gold (Au).

A sealing resin (not illustrated) may be additionally formed on the first semiconductor chip 120 and the circuit board 110 so as to protect the semiconductor package 100. The sealing resin may include an insulating resin, for example, an epoxy molding compound (EMC).

Figure 2:
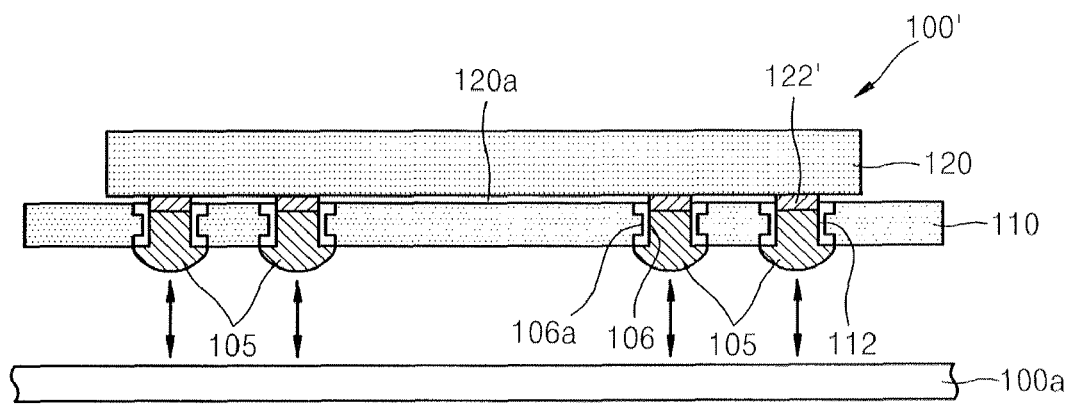
FIG. 2 is a cross-sectional view illustrating a semiconductor package according to another embodiment of the present general inventive concept.

FIG. 2 is a cross-sectional view of a semiconductor package 100' according to another embodiment of the present general inventive concept. The semiconductor package 100' may be similar to the semiconductor package 100 of FIG. 1, and thus detailed descriptions thereof will not be given herein.

Referring to FIG. 2, a portion of a first chip pad 122' of the first semiconductor chip 120 is inserted to the through hole 106 defined by the side wall of the conductor 112 disposed in the through hole 106a defined by the side wall of the circuit board 110. Accordingly, the first chip pad 122' may be directly in contact with the conductor 112 formed on the sidewall of the through hole 106a, and an alloy may be formed in the bonding of the solder ball 105 between the first chip pad 122' and the solder ball 105. The solder ball 105 may be electrically connected to an external electrical apparatus 100a. In addition, an interval between the first semiconductor chip 120 and the circuit board 110 may be reduced, compared to the distance between the semiconductor chip 110 and the circuit board 110 of the semiconductor package 100 of FIG. 1, since the portion of the first chip pad 122' is disposed in the through hole 106 to thus decrease an entire height of the semiconductor package 100' and the remaining portion of the first chip pad 122' is disposed between the semiconductor chip 120 and the circuit board 110. Thus, the surface 120a of the semiconductor chip 120 and a surface of the circuit board 110 facing the surface 120a are spaced apart from each other by a distance shorter than the thickness of the first chip pad 122'.

Figure 3:
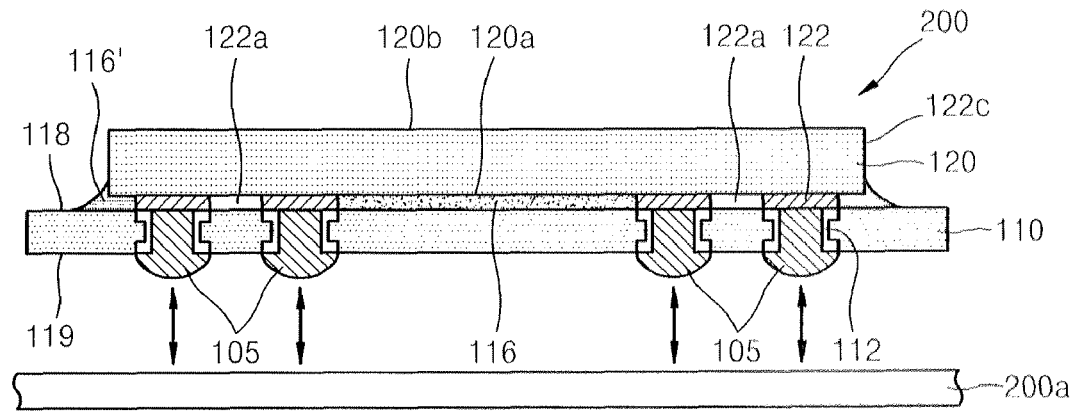
FIG. 3 is a cross-sectional view illustrating a semiconductor package according to another embodiment of the present general inventive concept.

FIG. 3 is a cross-sectional view of a semiconductor package 200 according to another embodiment of the present general inventive concept. The semiconductor package 200 may refer to the semiconductor package 100 of FIG. 1, and thus detailed descriptions thereof will not be given herein.

Referring to FIG. 3, adhesive members 116 and 116' may be formed between the first surface 118 of the circuit board 110 and a peripheral portion 120c and/or an operation (active) surface 120a of the first semiconductor chip 120 so as to fix the first semiconductor chip 120 on the circuit board 110. The adhesive members 116 and 116' may be an epoxy based material or an adhesive tape. For example, the epoxy based material may be used as the adhesive member 116' in the peripheral portion 120c of the first semiconductor chip 120, and the adhesive tape may be used as the adhesive member 116 between the operation surface 120a of the first semiconductor chip 120 and the first surface 118 of the circuit board 110 and vice versa. A portion 122a disposed between the first chip pads 122 may not be filled with the adhesive member 116 or 116' but be an empty space. The present general inventive concept is not limited thereto. It is possible that the portion 122a may be filled with the adhesive member 116 or 116' or other adhesive material. The solder ball 105 may be electrically connected to an external electrical apparatus 100a.

Figure 4:
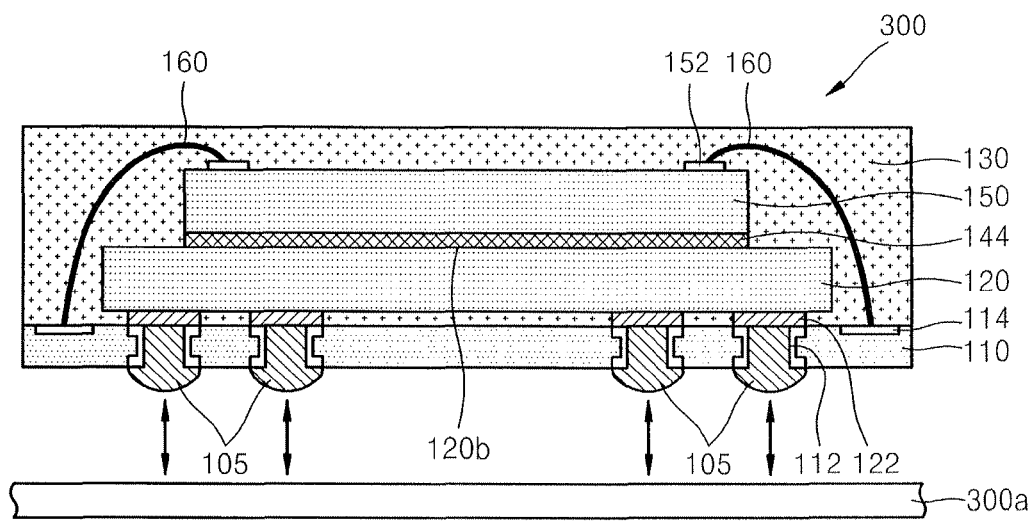
FIG. 4 is a cross-sectional view illustrating a semiconductor package according to another embodiment of the present general inventive concept.

FIG. 4 is a cross-sectional view illustrating a semiconductor package 300 according to another embodiment of the present general inventive concept. The semiconductor package 300 may use the semiconductor package 100 of FIG. 1, and thus detailed descriptions thereof will not be given herein.

Referring to FIG. 4, an adhesive layer 144 may be formed on a surface 120b opposite to an active surface 120a of the first semiconductor chip 120, and one or more second semiconductor chips 150 may be formed on the adhesive layer 144. In the present embodiment, the second semiconductor chip 150 includes a second chip pad 152. A conductive member such as a wire 160 may electrically connect the second chip pad 152 of the second semiconductor chip 150 with a substrate pad 114 of the circuit board 110. A sealing resin 130 may be additionally formed so as to encapsulate the first semiconductor chip 120, the second semiconductor chip 150, and the circuit board 110, and thereby protecting the semiconductor package 300. The substrate pad 114 may be connected with the conductor 112 through a board interconnection line (not illustrated) formed in the circuit board 110, such that the substrate pad 114 is connected with the solder ball 105 which is connected with the first chip pad 122. The solder ball 105 may be electrically connected to an external electrical apparatus 300a. The first and second semiconductor chips 120 and 150 may be the same type of products. However, the present general inventive concept is not limited thereto. It is possible that the first and second semiconductor chips 120 and 150 may be different types of products.

For example, both the first and second semiconductor chips 120 and 150 may be memory devices. Alternatively, the first semiconductor chip 120 and the second semiconductor chip 150 may respectively be a memory device and a logic device or an LSI device for a system in package (SIP).

Figure 5:
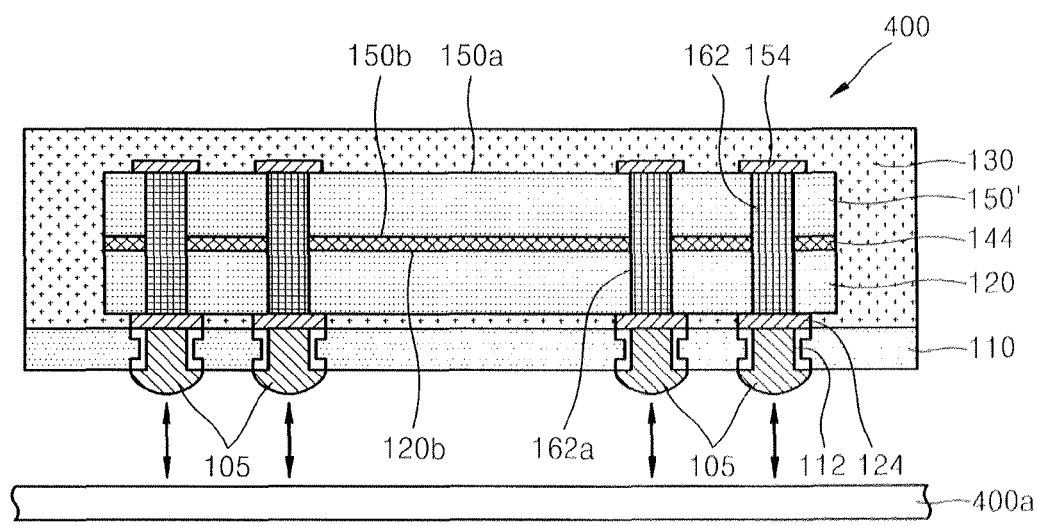
FIG. 5 is a cross-sectional view illustrating a semiconductor package according to another embodiment of the present general inventive concept.

FIG. 5 is a cross-sectional view illustrating a semiconductor package 400 according to another embodiment of the present general inventive concept. The semiconductor package 400 may use the semiconductor package 100 of FIG. 1, and thus detailed descriptions thereof will not be given herein.

Referring to FIG. 5, an adhesive layer 144 may be formed completely on a surface 120b opposite to the active surface 120a of the first semiconductor chip 120, and a second semiconductor chip 150', including one or more second chip pads 154, may be formed on the adhesive layer 144. The second semiconductor chip 150' includes the second chip pad 154 formed on an active surface 150a thereof, such an active surface 150a is opposite to a surface of the adhesive layer 144. In the present embodiment, the active surfaces 150a and 120a of the second semiconductor chip 150' and the first semiconductor chip 120 may face opposite directions to each other as illustrated in FIG. 5. The second semiconductor chip 150' and the first semiconductor chip 120 may be electrically connected with each other through a conductive member such as a penetration electrode 162. A through hole 162a is formed in the first semiconductor chip 120 and the second semiconductor chip 150' according to a laser drilling process or an etching process, and the through hole 162a of the first semiconductor chip 120 and the second semiconductor chip 150' is filled with a conductive material to form the penetration electrode 162. The penetration electrode 162 may be formed by stacking the first semiconductor chip 120 and the second semiconductor chip 150' and disposed in the through hole 162a. Alternatively, the penetration electrode 162 may be formed in each of the semiconductor chips 120 and 150' to protrude from each of surfaces of the semiconductor chips 120 and 150' facing each other to have half the thickness of the adhesive layer 144, and then the semiconductor chips 120 and 150' may be stacked with each other so as to electrically connect the penetration electrodes 162 of the semiconductor chips 120 and 150'. A sealing resin 130 is additionally formed to encapsulate the first and second semiconductor chips 120 and 150' and the circuit board 110 and thereby protecting the semiconductor package 400. A first chip pad 124 may be directly connected with the solder ball 105 that can be electrically connected to an external electronic apparatus 300a. The first and second semiconductor chips 120 and 150' may be the same type of products. However, the present general inventive concept is not limited thereto. It is possible that the first and second semiconductor chips 120 and 150' may be different types of products.

In the embodiments of FIGS. 4 and 5, the two semiconductor chips are stacked, however, the present general inventive concept is not limited thereto and thus the number of semiconductor chips that can be stacked may differ, for example, three or more.

Figure 6:
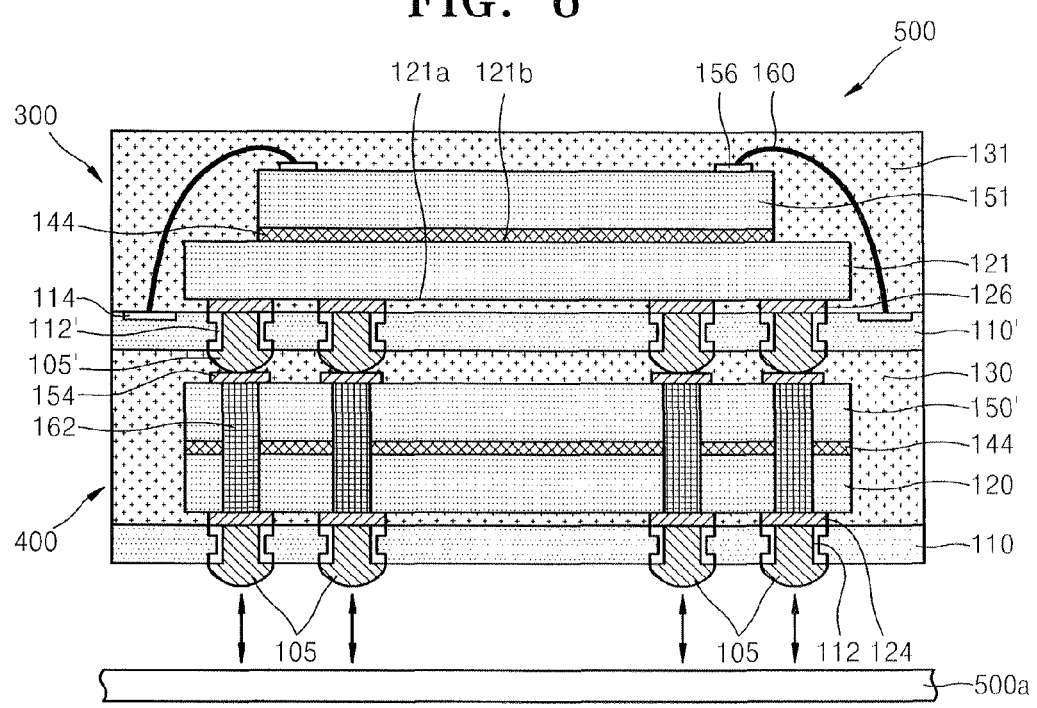
FIG. 6 is a cross-sectional view illustrating a semiconductor package according to another embodiment of the present general inventive concept.

FIG. 6 is a cross-sectional view illustrating a semiconductor package 500 according to another embodiment of the present general inventive concept. The semiconductor package 500 may use the semiconductor packages 300 and 400 of FIGS. 4 and 5, and thus detailed descriptions thereof will not be given herein.

Referring to FIG. 6, the semiconductor package 400 of FIG. 5 may be provided as a first semiconductor package and the semiconductor package 300 of FIG. 4 may be provided as a second semiconductor package on the first semiconductor package, so as to provide a stacked semiconductor package 500. In detail, the first semiconductor package may be formed by forming an adhesive layer 144 on a surface 120b opposite to an active surface 120a of a first semiconductor chip 120 and stacking one or more second semiconductor chips 150' on the adhesive layer 144. The second semiconductor chip 150' includes a second chip pad 154. The second semiconductor chip 150' and the first semiconductor chip 120 may be electrically connected with each other through a conductive member such as a penetration electrode 162. A sealing resin 130 is formed so as to encapsulate the first and second semiconductor chips 120 and 150' and a first circuit board 110 and thereby protecting the first semiconductor package 400. A solder ball 105 of the first semiconductor package may be directly connected with a first chip pad 124 and a first conductor 112 so that the solder ball 105 can be electrically connected with an external electronic apparatus. Meanwhile, according to the embodiments of the present general inventive concept, the first semiconductor chip 120 and the second semiconductor chip 150' may be the same type of products. However, the present general inventive concept is not limited thereto. It is possible that the first semiconductor chip 120 and the second semiconductor chip 150' may be different types of products.

The second semiconductor package may be formed by forming an adhesive layer 144 on a surface 121b opposite to an active surface 121a of a third semiconductor chip 121 and stacking one or more fourth semiconductor chips 151 on the adhesive layer 144. The fourth semiconductor chip 151 includes a fourth chip pad 156 electrically connected with a semiconductor device (not illustrated) formed therein. The fourth semiconductor chip 151 and a second circuit board 110' may be electrically connected with each other through a conductive member such as a wire 160 formed between the fourth chip pad 156 and a substrate pad 114 formed in the second circuit board 110'. A sealing resin 131 may be additionally formed so as to encapsulate the third semiconductor chip 121, the fourth semiconductor chip 151, and the second circuit board 110' to thus form the second semiconductor package. Meanwhile, the substrate pad 114 may be electrically connected with a second conductor 112' through its multi-layer type board interconnection line (not illustrated) formed in the second circuit board 110', in order for the substrate pad 114 to be electrically connected with the solder ball 105' electrically connected with the first chip pad 124. The substrate pad 114 may be electrically connected with another solder ball (not illustrated) that is not directly connected with the first chip pad 124 but is formed in the second circuit board 110' to contact the second chip pad 154, in order for the substrate pad 114 to be connected with the first semiconductor package 400. Here, the second semiconductor package 300 may be disposed on the first semiconductor package 400 by using a solder bonding process after removing a portion of the sealing resin 130 of the first semiconductor package 400 such that the second chip pad 154 is exposed due to the removing. Alternatively, a bonding pad (not shown) corresponding to the second chip pad 154 is formed on the sealing resin 130 of the first semiconductor package 400, and the solder ball 105' of the second semiconductor package 300 is bonded to the bonding pad to form the stacked semiconductor package 500 of the embodiment of FIG. 6. The solder balls 105 may be electrically connected to an external electrical apparatus 500a. Here, the third semiconductor chip 121 and the fourth semiconductor chip 151 may be the same type of products. However, the present general inventive concept is not limited thereto. The third semiconductor chip 121 and the fourth semiconductor chip 151 may be different types of products.

FIG. 7 is a cross-sectional view illustrating a semiconductor package 600 according to another embodiment of the present general inventive concept. The semiconductor package 600 may use the semiconductor packages 300 and 400 of FIGS. 4 and 5, and thus detailed descriptions thereof will not be given herein.

Referring to FIG. 7, a first semiconductor chip 120 and a second semiconductor chip 150', which are stacked with each other, may be mounted on a first region of a circuit board 110, and a fifth semiconductor chip 153 including a fifth chip pad 157 may be mounted on a second region of the circuit board 110. The fifth semiconductor chip 153 is electrically connected with the circuit board 110 through a conductive member such as a wire 160 connected between the fifth chip pad 157 and a substrate pad 114'. The substrate pad 114' may be connected with a solder ball 105 through a conductor 112. The solder ball 105 is connected to an external electrical apparatus 600a. The substrate pad 114' may be selectively connected with another solder ball bonded to a first chip pad 124 through a board interconnection line formed in the circuit board 110. A sealing resin 130 is additionally formed so as to encapsulate the first semiconductor chip 120, the second semiconductor chip 150', the fifth semiconductor chip 153, and the circuit board 110 and thereby protecting the semiconductor package 600.

FIG. 8 is a cross-sectional view illustrating a semiconductor package module 700 according to another embodiment of the present general inventive concept. The semiconductor package module 700 may use the semiconductor package 100 of FIG. 1, and thus detailed descriptions thereof will not be given herein.

Referring to FIG. 8, one or more of the semiconductor packages according to the above-described embodiments of the present general inventive concept, for example, a semiconductor package 101 corresponding to the semiconductor package 100 of FIG. 1 may be mounted in plural on a module board 140 in a horizontal direction H along a major surface of the module board 140 so as to compose the semiconductor package module 700. Here, a solder ball 105 of the semiconductor package 101 is bonded to a bond pad 142 of the module board 140 so that an electrical signal can be exchanged between the semiconductor package 101 and the module board 140. Although the semiconductor package 101 using a circuit board 110 is illustrated in FIG. 8, the present general inventive concept is not limited thereto and thus a semiconductor package using a lead frame, for example, a thin quad flat package (TQFP) and the semiconductor package 101 according to the embodiment of FIG. 1 may be mounted together to form a semiconductor package module. The module board 140 may include one or more interconnection lines 140a formed therein to connect the bond pad 142 and/or to form an electrical terminal to be connected to an external electrical apparatus 700a.

FIG. 9 is a cross-sectional view illustrating a semiconductor package module 800 according to another embodiment of the present general inventive concept. The semiconductor package module 800 may use the semiconductor packages 300 and 400 of FIGS. 4 and 5, and thus detailed descriptions thereof will not be given herein.

Referring to FIG. 9, one or more semiconductor packages 300 and 400 having a multi chip package (MCP) structure may be mounted on a module board 140. The multi chip package structure mounted on the module board 140 may have a wire bonding structure like the semiconductor package 300, or may have a penetration electrode structure like the semiconductor package 400. Alternatively, the multi chip package structure mounted on the module board 140 may have a compounded structure of the wire bonding structure and the penetration electrode structure. The semiconductor packages 300 and 400 of the embodiment of FIG. 9 may be bonded to a board pad 142 of the module board 140 so as to exchange an electrical signal with the module board 140. The module board 140 may include one or more interconnection lines 140b to electrically connect the board pads 142 and/or to form an external terminal disposed opposite to the board pad 142 with respect to the module board 140 to be electrically connected to an external electrical apparatus 800a.

FIGS. 10 through 13 are cross-sectional views illustrating a method of manufacturing the semiconductor package of FIG. 1, according to an embodiment of the present general inventive concept.

Figure 10:
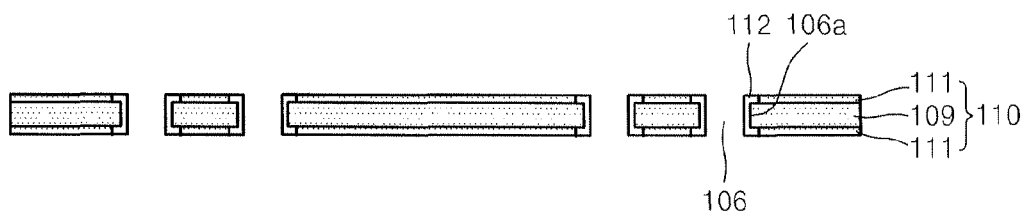
FIGS. 10 through 13 are cross-sectional views illustrating a method of manufacturing the semiconductor package of FIG. 1, according to an embodiment of the present general inventive concept.

Referring to FIG. 10, a circuit board 110 including a side wall to define a through hole 106a is prepared. The circuit board 110 may include an insulating layer 109 formed of a polymer, an insulating resin, or the like, and a solder resist layer 111 formed of epoxy, silica, or the like. A conductor 112 is formed on the sidewall of the circuit board 110 to define a through hole 106, and the conductor 112 may be formed using a typical plating method. A substrate interconnection line (not shown) may be additionally formed in the circuit board 110.

Figure 11:
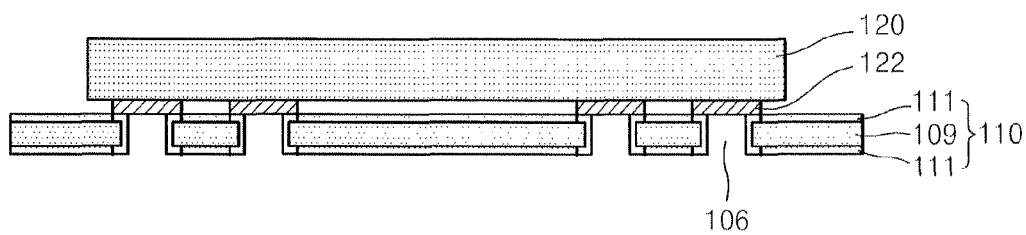

Referring to FIG. 11, a first chip pad 122 of a first semiconductor chip 120 is aligned with the through hole 106 defined by a side wall of the conductor 112 and mounted correspondingly on the conductor 112. The first chip pad 122 may be soldered to the conductor 112 so as to bond the first semiconductor chip 120 to the circuit board 110. Meanwhile, as illustrated in FIG. 3, an adhesive member 116', (refer to FIG. 3) may be further formed at an edge portion of the first semiconductor chip 120 in order to fix the first semiconductor chip 120 to the circuit board 110. Also, an adhesive member 116 (refer to FIG. 3) may be additionally formed between the first semiconductor chip 120 and the circuit board 110 so as to firmly fix the first semiconductor chip 120 to the circuit board 110.

Figure 12:
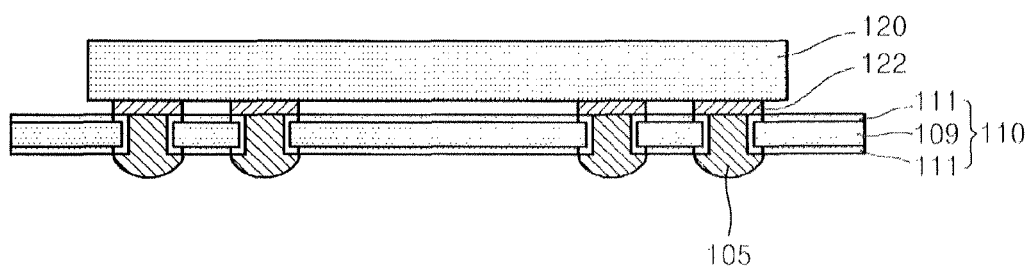

Referring to FIG. 12, a solder ball 105 is disposed in the through hole 106, and a bonding process is performed on the solder ball 105, the first chip pad 122, and the conductor 112. The bonding process involving the solder ball 105, the first chip pad 122, and the conductor 112 may employ a typical process of applying heat and bonding in a furnace and an infrared (IR) reflow process of applying an IR wave. As the solder ball 105 is bonded to the first chip pad 122 and the conductor 112, an alloy of the first chip pad 122, the conductor 112, and the solder ball 105 may be formed at an interface between the first chip pad 122 and the solder ball 105, thereby improving the solder joint.

Figure 13:
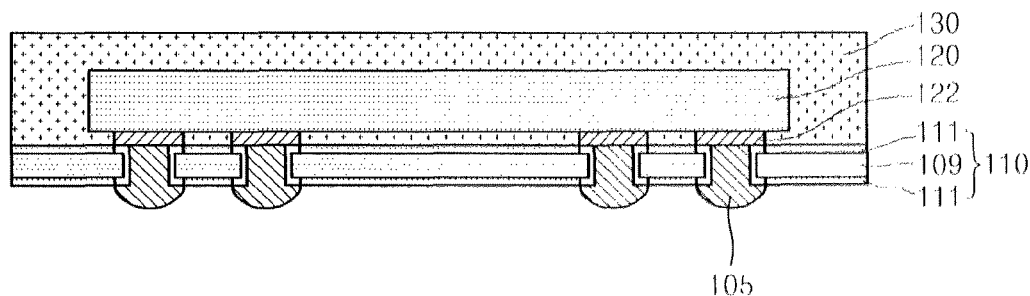

Referring to FIG. 13, a sealing resin 130 may be formed so as to cover the first semiconductor chip 120 and the circuit board 110. The sealing resin 130 may include an epoxy mold compound (EMC) or an encapsulant formed of another resin other than the EMC.

Figure 14:
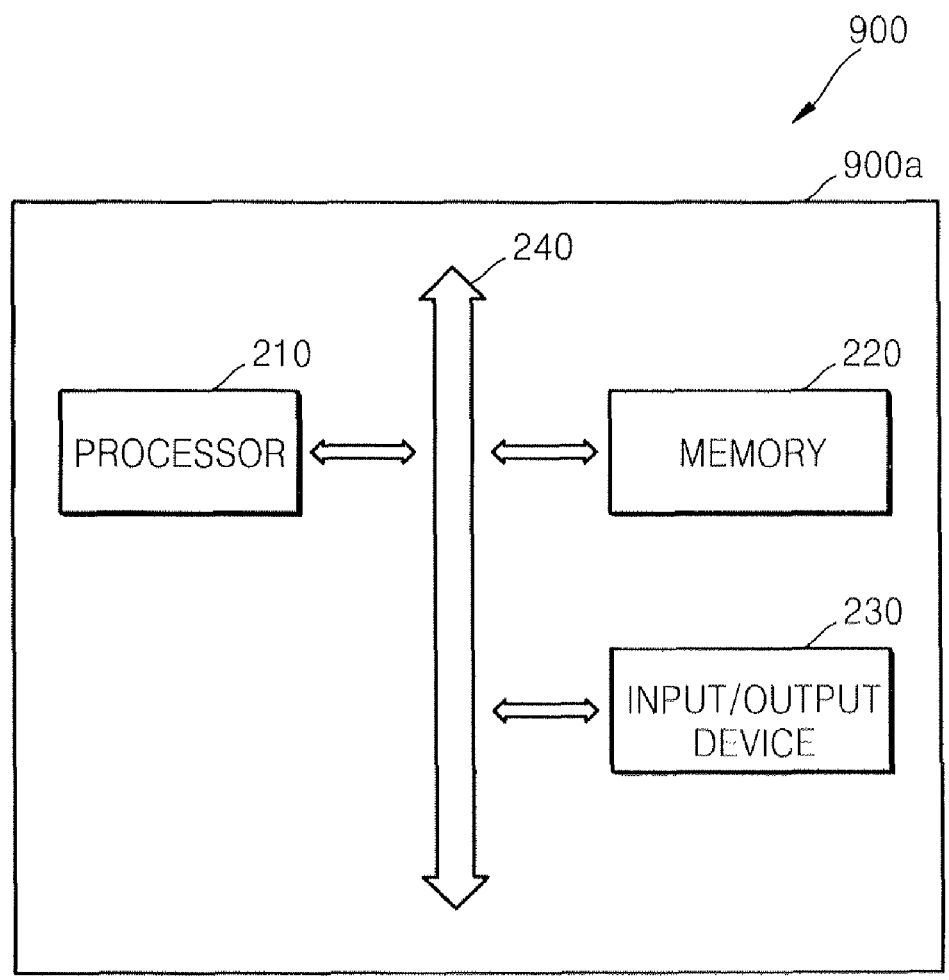
FIG. 14 is a block diagram illustrating a system employing a semiconductor device including a semiconductor package module according to the present general inventive concept.

FIG. 14 is a block diagram of a system 900 employing a semiconductor package or a semiconductor package module according to the embodiments of the present general inventive concept.

Referring to FIG. 14, a processor 210, an input/output device 230, and a memory 220 may perform data communication with each other using a bus 240. The processor 210 may execute program and control the system 900. The input/output device 230 may be used for input or output of data of the system 900. The system 900 may be connected with an external apparatus, for example, a personal computer or a network using the input/output device 230 to exchange data with the external apparatus.

The processor 210, the input/output device 230, and/or the bus 240 may be the external electrical apparatus 100a, 200a, 300a, 400a, 500a, 600a, 700a and/or 800a, as illustrated in FIGS. 1-9. It is possible that the bus 240 may be connected to the solder balls 105 or interconnection lines 140a and 140b of the semiconductor package of FIGS. 1-9, respectively, and the bus 240 is electrically connected to the processor 210 and the input/output device 230. The system 900 may include a housing 900a in which the processor 210, the memory 220, the input/output device 230, and the bus 240 are installed as a single body. The input/output device 230 may include a user interface formed on a surface of the housing 900a to receive a user selection signal from a user to control the processor 210 and the memory 220. At least one of the input/output device 230 and the bus 240 may further include terminals formed on another surface of the housing 900a to be electrically connected to communicate with the external apparatus. The processor 210 controls the memory 220 to output data stored in the memory 220 to the external apparatus or to receive data to be stored according to a selection signal of the user interface of the input/output device 230 or the bus 240, or a signal from the external apparatus.

The memory 220 may include the semiconductor packages 100, 100' 200, 300, 400, 500 and 600 or the semiconductor package modules 700 and 800 of the above-described embodiments. For example, the memory 220 may store code and data for operation of the processor 210.

For example, the system 900 may be used for a mobile phone, an MP3 player, a navigation device, a solid state disk (SSD), or a household appliances.

According to a semiconductor package of the present invention, an insulation layer, for example, an underfill, formed between a semiconductor chip and a circuit board can be removed. Therefore, the reliability of the semiconductor package can be improved and manufacturing costs can be reduced. Also, since a chip pad is directly bonded to a solder ball, the semiconductor package is reduced in thickness and is advantageous for a small-sized electronic apparatus. In addition, more semiconductor chips can be mounted on a flip chip package having the same thickness, and a semiconductor package module where the packages are mounted can be utilized for a small-sized electronic apparatus with a large capacity.

While the present general inventive concept has been particularly shown and described with reference to exemplary embodiments thereof, it will be understood by one of ordinary skill in the art that various changes in form and details may be made therein without departing from the spirit and scope of the present general inventive concept as defined by the following claims.

What is claimed is:

1. A semiconductor package, comprising:
    a first semiconductor package comprising a first circuit board including a first through hole therein, a first conductor formed on a sidewall of the first through hole, a first semiconductor chip including a first chip pad mounted on the first circuit board, a second semiconductor chip including a second chip pad formed on the first semiconductor chip, a penetration electrode electrically connecting the first semiconductor chip with the second semiconductor chip, a first solder ball disposed in the first through hole to connect the first conductor with the first chip pad, and a sealing resin encapsulating the first circuit board, the first semiconductor chip, and the second semiconductor chip; and
    a second semiconductor package comprising a second circuit board including a second through hole therein, a second conductor formed on a sidewall of the second through hole, a third semiconductor chip including a third chip pad mounted on the second circuit board, a fourth semiconductor chip including a fourth chip pad formed on the third semiconductor chip, a conductive member electrically connecting the third semiconductor chip with the fourth semiconductor chip, a second solder ball disposed in the second through hole to connect the second conductor with the third chip pad, and a sealing resin encapsulating the second circuit board, the third semiconductor chip, and the fourth semiconductor chip,
    wherein the second semiconductor package is formed on the first semiconductor package and electrically connected with the first semiconductor package through the second solder ball.

2. The semiconductor package of claim 1, wherein the first chip pad or the third chip pad is directly in contact with the first conductor or the second conductor, respectively.

3. The semiconductor package of claim 1, wherein the second solder ball is directly in contact with the second chip pad.

* * * * *